US009209767B1

(12) United States Patent
Svendsen

(10) Patent No.: US 9,209,767 B1
(45) Date of Patent: Dec. 8, 2015

(54) INPUT CURRENT LIMITED POWER SUPPLY AND AUDIO POWER AMPLIFIER FOR HIGH POWER REPRODUCTION OF NONDETERMINISTIC SIGNALS

(71) Applicant: MOTOROLA SOLUTIONS, INC, Schaumburg, IL (US)

(72) Inventor: Peter William Hilding Svendsen, Virum (DK)

(73) Assignee: Motorola Solutions, Inc., Schaumburg, IL (US)

( * ) Notice: Subject to any disclaimer, the term of this patent is extended or adjusted under 35 U.S.C. 154(b) by 6 days.

(21) Appl. No.: 14/288,566

(22) Filed: May 28, 2014

(51) Int. Cl.
*H03J 1/06* (2006.01)
*H03G 3/00* (2006.01)
*H03F 3/181* (2006.01)
*H04W 52/02* (2009.01)

(52) U.S. Cl.
CPC .............. *H03G 3/004* (2013.01); *H03F 3/181* (2013.01); *H04W 52/0261* (2013.01); *H03F 2200/03* (2013.01)

(58) Field of Classification Search
CPC ........... H03J 1/06; H04B 1/18; G06F 1/3203; H04W 52/0277
USPC .......... 455/341, 343.5, 309, 3.06, 221, 127.3, 455/253.2; 381/108, 120, 300
See application file for complete search history.

(56) References Cited

U.S. PATENT DOCUMENTS

| | | | |
|---|---|---|---|
| 3,889,256 A * | 6/1975 | Cieslak et al. | 340/384.4 |
| 4,348,644 A | 9/1982 | Kamiya | |
| 4,598,255 A * | 7/1986 | Hong | 330/297 |
| 5,767,744 A | 6/1998 | Irwin et al. | |
| 5,812,028 A * | 9/1998 | Adachi et al. | 330/261 |
| 6,323,729 B1 | 11/2001 | Sevenhans et al. | |
| 6,798,177 B1 | 9/2004 | Liu et al. | |
| 7,701,294 B1 * | 4/2010 | Yun | 330/297 |
| 9,048,790 B1 * | 6/2015 | Refaeli et al. | 1/1 |
| 2002/0102952 A1 * | 8/2002 | Leizerovich | 455/126 |
| 2006/0238258 A1 | 10/2006 | D'Amore | |

(Continued)

FOREIGN PATENT DOCUMENTS

WO 2008111046 A1 9/2008
WO 2013012738 A1 1/2013

OTHER PUBLICATIONS

Murata EDLC, Pump up the volume! Supercapacitors enhance audio quality and power in mobile phones, May 2008, pp. 1-8.

*Primary Examiner* — Minh D Dao
(74) *Attorney, Agent, or Firm* — Barbara R. Doutre

(57) ABSTRACT

A method and apparatus for amplifying audio signals without exceeding an input current limit budgeted for the audio power amplifier circuit includes an intermediate energy storage between a battery and the audio power amplifier which provides an energy reserve to support amplifying peaks where the peaks have a peak power that is greater than the power that can be drawn from the battery due to the input current limit. Speech signals, which include substantial periodic content having short peaks relative to a pitch period, can be amplified without depleting the intermediate energy storage, allowing the intermediate energy storage to recover after a peak and before occurrence of a next peak. When an audio signal is amplified that results in depletion of the intermediate energy storage, a depletion recovery circuit reduces the overall audio gain to reduce the power demand of the audio power amplifier so as to substantially avoid distortion.

23 Claims, 4 Drawing Sheets

(56) References Cited

U.S. PATENT DOCUMENTS

| | | |
|---|---|---|
| 2010/0244788 A1 | 9/2010 | Chen |
| 2011/0128075 A1* | 6/2011 | Maier et al. ................. 330/144 |
| 2011/0158437 A1* | 6/2011 | Taffner et al. ................ 381/120 |
| 2012/0223980 A1* | 9/2012 | Hollevoet et al. ............ 345/690 |
| 2013/0083947 A1 | 4/2013 | MOERTEL et al. |
| 2013/0089161 A1 | 4/2013 | HEINEMAN |
| 2014/0098979 A1* | 4/2014 | Osborn et al. ................ 381/300 |
| 2015/0200640 A1* | 7/2015 | Hogan et al. ................. 381/108 |

\* cited by examiner

INPUT CURRENT LIMITED POWER SUPPLY AND AUDIO POWER AMPLIFIER FOR HIGH POWER REPRODUCTION OF NONDETERMINISTIC SIGNALS

FIELD OF THE DISCLOSURE

The present disclosure relates generally to audio power amplifier circuits, and more particularly to audio power amplifiers for battery powered portable devices where current sourced by the battery is limited and the signal being amplified may require more instantaneous power than can be sourced from the battery due to the current limit.

BACKGROUND

The International Electrotechnical Commission, in standard IEC 60950-1, limits the current that can be drawn from a battery having less than 30 volts open circuit voltage to 8 amperes for battery powered devices. Accordingly, this standard applies to virtually all portable two-way radio devices, many of which operate at either a 3.6 volts or a 7.2 volts nominal operating voltage. These nominal voltage levels are achieved using one equivalent lithium ion battery cell for the 3.6 V nominal output voltage, or the equivalent of two lithium ion cells connected in series to achieve the 7.2 V nominal output. Since the current output of the battery is limited to 8 A, or less, by an internal safety circuit, more power is available from a battery having a higher nominal voltage than one having a lower nominal voltage. However, a 7.2V battery with higher output power than that of the 3.6V battery will have both weight and volume being two to four times that of the 3.6V battery for similar battery cell capacity. In a practical implementation of a 7.2V battery it would need to have four times the volume and weight of the equivalent 3.6V battery to enable it to source twice the power, for equal power dissipation, cell stress due to load current etc.

Some segments of the portable device market, including portions of the portable two-way radio device market, prefer low weight and low (spatial) volume devices, which tends to favor using a smaller battery in a single cell topology having a lower nominal voltage. Given a battery current limit, the use of a lower voltage battery presents a problem with regard to audio fidelity because the power available to the portable two-way radio device is less than that available from a substantially larger battery having a higher nominal voltage under the same battery current limit. When a portable two-way radio device receives an audio signal, the audio signal is amplified and played over a loudspeaker so the user of the portable two-way radio device can hear the audio signal without having to, for example, hold the speaker up to the user's ear as when using a telephone. Furthermore, given that the user of the portable two-way radio device can be located in a noisy environment, the audio power needs to be sufficiently loud and distortion-free for the user to understand received audio signals under such conditions.

An audio power amplifier is used to amplify received audio signals and drive a speaker with the amplified audio signal. A peak instantaneous power of, for example, 12 Watts is needed to provide the desired distortionless intelligibility and output power to meet certain industry standards. However, given the limitation on current that can be drawn from the battery under IEC 60950-1, and given the current budget needed to concurrently operate all portions of the portable two-way radio device (e.g. RF transmitter, RF receiver, controller, audio power amplifier etc.) without exceeding the battery current limit, and in view of the losses due to inefficiency, it is not possible to draw the necessary instantaneous current directly from the battery to support instantaneous 12 W peak audio power. As a result, using conventional audio power amplification that relies on the combination of audio power amplifier supply voltage, or maximum peak output voltage of the audio power amplifier, and loudspeaker impedance to limit the peak current drawn from the battery to the budgeted value, peak clipping will occur, causing significant distortion and reducing intelligibility.

Accordingly, there is a need for a method and apparatus for amplifying received audio signals in a portable two-way radio device under current budgeted conditions in a way that does not exceed a budgeted current limit and which provides sufficient peak audio power to allow a user of the portable two-way radio device to hear and understand the received audio in noisy environments.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
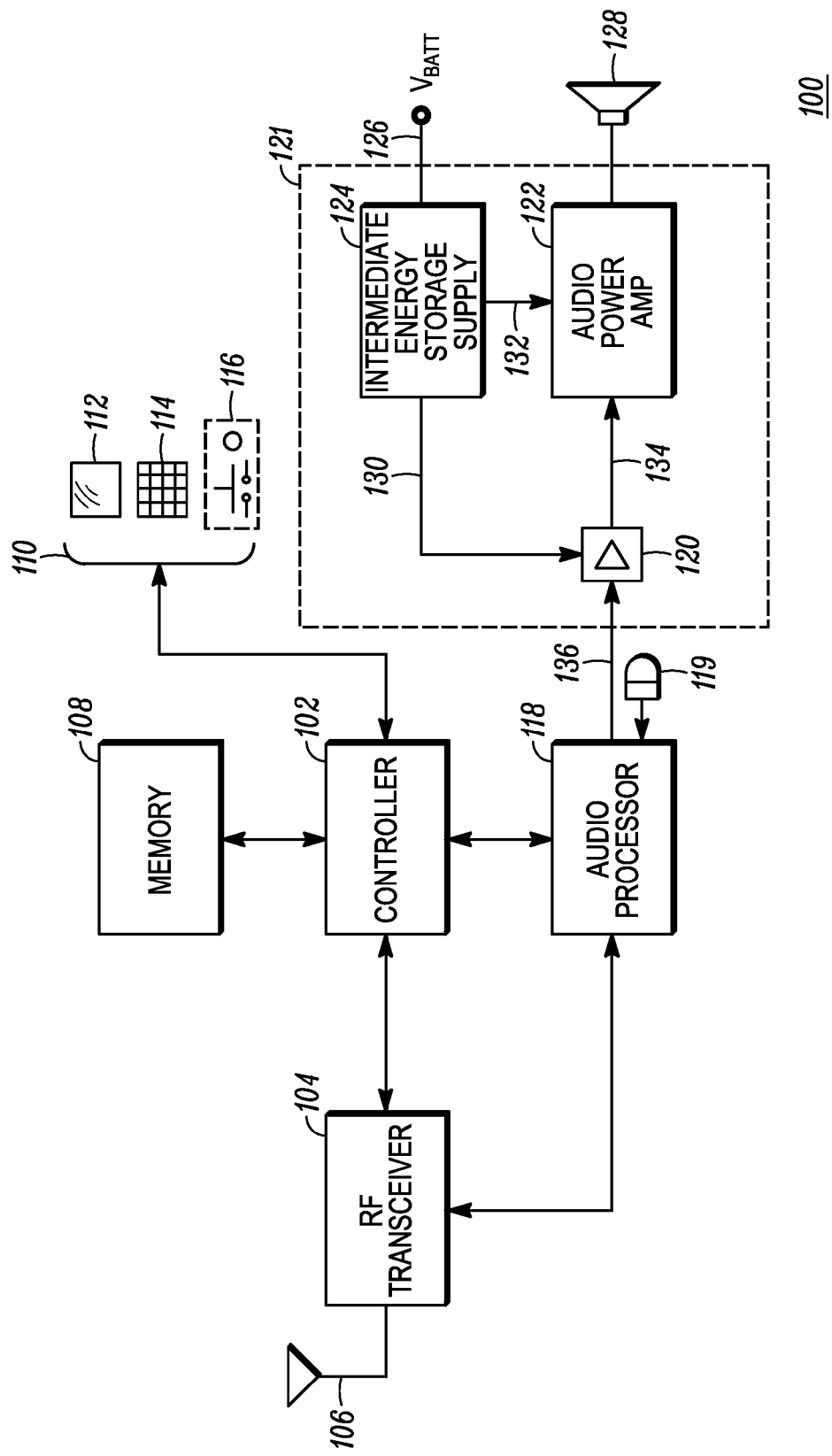
FIG. 1 is a block diagram of a portable two-way radio device having peak power audio amplification with input current limiting, in accordance with some embodiments.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Some embodiments as disclosed herein include a method for powering an audio power amplifier includes boosting a voltage level of a battery to a boost voltage level across a boost capacitor at an output of a boost stage without exceeding a preselected input current limit. The boost voltage level is higher than the voltage level of the battery and higher than a supply voltage required for the audio power amplifier to output a predefined maximum peak power into a load. The method further includes deriving the supply voltage from the boost voltage and providing the supply voltage to the audio power amplifier to power the audio power amplifier. The audio power amplifier amplifies an input signal to produce an amplified signal. The method further includes comparing a state of charge indication parameter to a depletion threshold, wherein the state of charge indication parameter is dependent on the boost voltage, and, when the state of charge indication parameter is below the depletion threshold, adjusting a gain of a pre-amplifier that provides the input signal to the audio power amplifier.

FIG. 1 is a block diagram of a portable two-way radio device 100 having peak power audio amplification with input current limiting in accordance with some embodiments. The portable two-way radio device 100 is a battery powered two-way communications device that operates in a half-duplex or full-duplex communication modes where, upon receiving an audio signal, the audio signal is amplified and played over a speaker. When used in the half-duplex communication mode, to send an audio signal (e.g. speech) the user presses a "push to talk" (PTT) button, and while the user is speaking the resulting audio signal from the user's voice is transmitted. In full-duplex communication mode audio signals are sent and received simultaneously, once a call has been set-up.

The portable two-way radio device 100 includes a controller 102 which can include, for example, a microprocessor. The controller 102 is coupled to a memory 108 that can include instruction code which is executed by the controller 102 for operating the portable two-way radio device 100 in accordance with design parameters and user input. The memory 108 can represent an aggregate of various types of memory including read only memory (ROM), random access memory (RAM), flash memory, and other types of memory.

The controller 102 is further coupled to a radio frequency (RF) transceiver 104 that includes both a transmitter and a receiver for transmitting and receiving radio frequency signals, such as those commonly used by portable two-way radio devices. The transceiver 104 uses an antenna 106 for transmitting and receiving signals over the air, and includes circuitry and components for RF operations, including modulation, demodulation, mixing, frequency generation, filtering, amplification, and so on. The transceiver 104 can receive digital audio signals from an audio processor 118 and modulate a carrier wave at a selected frequency using any of various digital modulation techniques. Likewise, the transceiver 104 can receive modulated RF signals and extract, through demodulation, digital audio signals that are provided to the audio processor 118 by the transceiver 104. The controller 102 can provide output to, and receive input from, various user interface components 110, which can include, for example, a numeric or alphanumeric keypad 112, a graphical display system 114, the PTT switch 116 and other buttons and knobs for selecting settings and controlling levels.

The audio processor 118 receives digital audio signals from, and provides such signal to, the RF transceiver 104. The digital audio signals can include digitized speech signals, and in fact they will most prevalently be voice signals. A microphone 119 is used to convert acoustic signals received at the microphone 119 into analog electrical audio signals, which the audio processor 118 digitizes and processes. For example, upon the user of the portable two-way radio device 100 pressing the PTT button 116, the audio processor 118 commences sampling the output of the microphone 119 to produce a digital audio signal. The digital audio signal can be presumed to be a speech signal, and can be further processed by, for example, voice encoding techniques to produce a digital audio signal for transmission by the transceiver 104.

When the audio processor 118 receives a digital audio signal from the transceiver 104 it processes the digital audio signal by, for example, decoding, filtering, and amplification, and produces an analog audio signal 136 that is to be amplified and played over, for example, a speaker 128. The audio signal 136 is amplified by an audio power amplification circuit 121 to a desired level. The audio power amplification circuit 121 is powered from the battery at a battery input 126, which is also shared by the other components of the portable two-way radio device 100. The audio power amplification circuit 121 is actively limiting the magnitude of current it can draw from the battery. The limit for the magnitude of input current that the audio power amplification circuit 121 can draw from the battery can be based on a current budget for a total current that can be drawn from the battery by the portable two-way radio device 100. That is, the input current limit for the audio power amplification circuit 121 will be a portion of the total current that can be drawn from the battery by the portable two-way radio device 100, and it has to be low enough so as to assure that all other components of the portable two-way radio device 100 can operate when the audio power amplification circuit 121 is drawing its maximum budgeted input current (i.e. the input current limit) according to an input current budget limit.

The maximum power available at the battery input 126, in light of the maximum battery voltage and the input current limit, can be less than the peak (instantaneous) power necessary to amplify the audio signal 136 at the speaker 128, in light of the volume setting selected by the user and the magnitude of the input audio signal 136. In some cases even the average power that would be needed (over a given time period) can exceed the available input power.

However, speech signals have a high crest factor and thus require high peak to average power ratio to achieve high intelligibility. Tones, and other non-speech sounds, do not require the same level of peak power for fidelity as does speech, for a given desired loudness. Speech signals contain substantial periodic content, particularly in vowel portions of speech, where the pitch period has peaks of power higher than the average power occupying 25% or less, and often 15% or less, of a pitch period, and the remainder of the pitch period averaging substantially less in power than the average power. Thus, typical voiced speech can be considered having pitch periods with power duty cycle of 25% or less. Other portions of speech, such as fricative speech, tends to be shorter in duration and between vowel portions of speech. This means that speech signals only need a relative high power for a short time, relative to the average power over the pitch period.

To accommodate the high peak power requirements within the pitch period, an intermediate energy storage circuit 124 stores energy and provides power to an audio power amplifier 122 at a supply voltage 132 to drive the speaker 128. In particular, the intermediate energy storage circuit includes an input current limiting boost stage that boosts the input battery voltage 126 to a higher voltage level (compared to the battery voltage) across a bulk energy storage capacitor (not shown). The nominal storage voltage is higher than that required by the audio power amplifier 122 for it to deliver the predefined (nominal) maximum peak power into the speaker load, thus storing a surplus of energy. This storage voltage is used to derive a supply voltage 132 that powers the audio power amplifier 122, and the surplus of energy in the storage capacitor can be drawn to cover the power shortage incurred by input current liming, to meet the peak power demands within the pitch period and so of voiced speech signals in general.

When large signals with low crest factor are being amplified, however, or when the speech signals simply require more average power (at a given volume setting) than can be provided, the energy storage in the intermediate energy storage circuit 124 can be depleted, causing the source voltage 132 to drop low enough to otherwise result in peak clipping at the audio power amplifier 122. A depletion state can occur, for example, when the sustained average power demand of the signal being amplified exceeds the power that can be provided by the boost stage due to the input current limit imposed by the current budget for the audio power amplification circuit 121.

To address depletion, the intermediate energy storage circuit includes a depletion recovery circuit that adjusts a gain signal 130 which controls the gain of a pre-amplifier 120 that amplifies the audio signal 136 from the audio processor 118 to produce an input signal 134 that is amplified by the audio power amplifier 122. The pre-amplifier 120 can be, for example, implemented by a digital signal processor, or it can be an analog amplifier with an adjustable gain, or an equivalent. In some embodiments, when the supply voltage 132 falls below a threshold, the gain signal 130 is adjusted to cause the gain of the pre-amplifier 120 to decrease, thus, reducing the level of the input signal 134, and resulting in the audio power amplifier 122 requiring less power to amplify the input signal 134. The gain of the pre-amplifier 120 can be adjusted quickly yet inaudible in response to a depletion condition being detected so that any significant clipping or distortion at the audio power amplifier 122 can be avoided. While decreasing the magnitude of the input signal 134 will result in a lower output power at the speaker 128, the fidelity of the amplified audio signal can substantially be preserved. When the gain of the pre-amplifier 120 is adjusted down sufficiently to cause a surplus of input power, or audio signal 136 changes, such that the intermediate energy storage circuit 124 recovers thus ending the depletion condition, the gain control signal 130 can be adjusted to cause the gain of the pre-amplifier 120 to increase up to its nominal gain value. Thus, the intermediate energy storage circuit 124 can source power to the audio power amplifier 122 in a way that allows speech in the input signal 134 to be amplified to peak power levels that significantly exceed an input power level available at the battery input 126 to the audio amplifier circuit due to the input current limit. For signals that do cause depletion of the intermediate energy storage circuit 124, distortion (e.g. clipping) is avoided by the depletion recovery action of adjusting the gain of the pre-amplifier 120 in response to an indication of depletion occurring. When depletion conditions end, the gain of the pre-amplifier recovers so that any subsequent speech signals will be at the desired audio volume including peak power, and substantially free of distortion. Depletion recovery is seamless and perceived as intonation, since gain adjustments are minor and of short duration.

Figure 2:
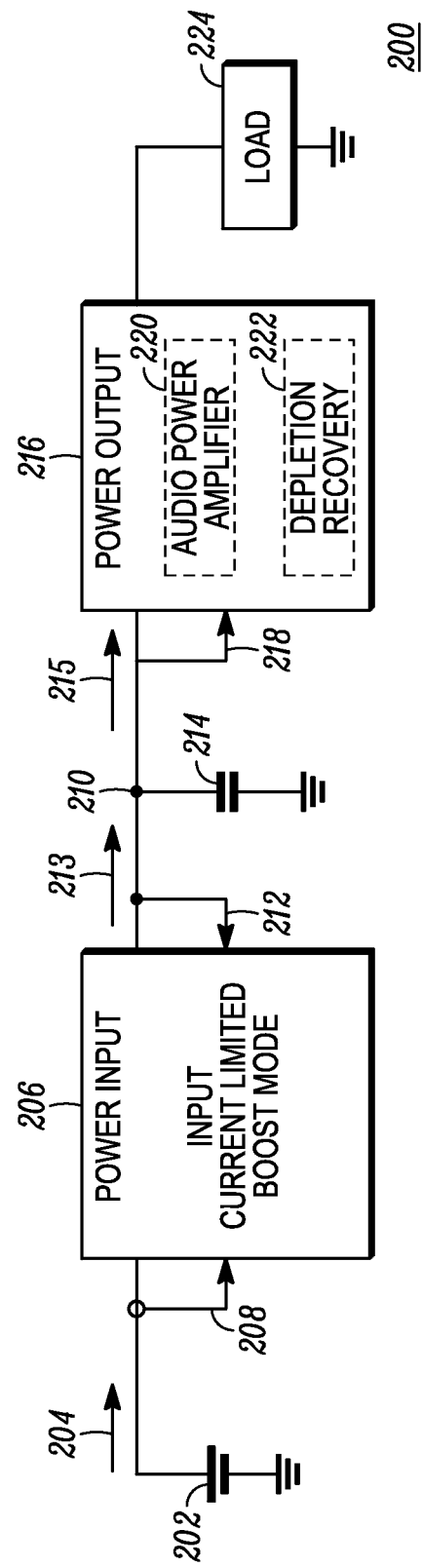
FIG. 2 is a block diagram of a power control architecture, in accordance with some embodiments.

FIG. 2 is a block diagram of a power control architecture 200 in accordance with some embodiments. The power control architecture 200 represents the main functionality for providing power to an audio power amplifier that draws peak power in excess of an effective input power limit due to input current limiting. The power control architecture 200 can be incorporated into a device, such as, for example, a portable two-way radio device. A battery 202 provides voltage and an input current (as represented by arrow 204) to a power input stage 206. The battery 202 can be used to power other circuitry of the device in which the power control architecture 200 is disposed, and accordingly, a current limit can be placed on the input current 204 in accordance with a current budget. The power input stage 206 includes a boost converter that boosts the battery voltage up to a regulated level on line 210. The power input stage 206 uses current sensing 208 to ensure that the input current limit is observed, and that the power input block does not draw more current than the budgeted current limit. The power input stage 206 also uses output voltage sensing 212 to regulate the output of the boost regulator to the selected boosted voltage level on line 210. The power input stage 206 sources the boost converter output current 213 to a boost capacitor 214 with the delivered power being equal to the product of the instantaneous current 213 and instantaneous voltage on line 210. The boost capacitor 214 stores charge to act, at least in part, as an intermediate energy storage supply (e.g. 124 of FIG. 1). Thus, during normal operation, the voltage on line 210 will be higher than the battery voltage. If the voltage on line 210 begins dropping below the selected boost level, however, the power input stage 206 will not exceed the budgeted limit of the input current 204 in attempting to regulate the voltage on line 210 to the selected boost level.

A power output stage 216 draws power from the boost capacitor 214 to power an audio power amplifier 220, which provides a power amplified audio signal to a load 224 (e.g. a speaker) from an input audio signal source (e.g. 136). The power drawn by the power output stage 216 is equal to the product of the instantaneous input current 215 and the instantaneous voltage on line 210. Since the input audio signal varies with time, the instantaneous output power of the audio power amplifier 220 will vary accordingly, as will average power over a given time period, based on, for example, voice characteristics, volume setting, etc. As a result, the power consumption of the power output stage 216 can be such that it can exceed the power that can be provided by the output of the power input stage 206. When the input current 215 to the power output stage 216 exceeds the current 213 that can be provided by the power input stage 206, the boost capacitor will begin to source current, and the voltage on line 210 will begin to drop as charge is drained from the boost capacitor 214, since the power input stage 206 cannot exceed its budgeted input current limit. However, the nominal boost voltage is selected such that the voltage on line 210, which corresponds to charge stored in the boost capacitor 214, provides voltage overhead sufficient to allow the preselected maximum peak output power of the power output stage 216 to exceed the power that can be provided by the power input stage 206. Charge stored in the boost capacitor 214 can sustain sufficient overhead voltage to the audio power amplifier 220 to provide output peaks at a power level substantially above the average power level that can be provided by the output of the power input stage 206. The boost voltage on line 210 can drop during such peaks. However, if the average power consumed by the power output stage 216 for one or more pitch periods exceeds that which can be provided by the power input stage 206, the voltage on line 210 will continue to decrease and may eventually reach a critically low level, causing a depletion state. The required amount of energy stored in the boost capacitor is dependent on the application and equal to:

$$E = \tfrac{1}{2} * C_{boost} * (V^2_{boost\_nominal} - V^2_{boost\_minimum})$$

Where:

E is energy necessary to be stored to support speech amplification;

$C_{boost}$ is the capacitance of the boost capacitor in Farads;

$V_{boost\_nominal}$ is the selected nominal boost voltage on line 210; and $V_{boost\_minimum}$ may be selected as the critically low voltage or threshold level on line 210, preferably with some margin that ensures sustained performance of power an audio power amplifier 220 of the power output stage 216 for some further decrease of the voltage on line 210. Obviously, for a given required amount of stored energy a higher nominal boost voltage results in the boost capacitor being smaller in capacitance and physical size.

The depletion state can be detected by a depletion recovery circuit 222, which senses a state of charge indication parameter, such as the voltage on line 210 (in the present example). The state of charge indication parameter is dependent on the boost voltage on line 210, and can be the boost voltage or any other voltage that depends on the boost voltage which can indicate when the boost voltage is, or is becoming, depleted. When the voltage, in the present example, on line 210 drops below a depletion threshold level a depletion recovery circuit 222 acts to reduce the power consumption of the audio power amplifier 220 by reducing the gain of a pre-amplifier stage, at a predetermined rate, that provides the input audio signal to the audio power amplifier 220. By reducing the gain at a rate, rather than, for example, in large steps, the continuity of the audio signal can be maintained, rather than introducing a step into the audio signal. The depletion threshold level can be below the nominal boost voltage level that the power input stage 206 is configured to provide (as long as its input current is below the input current limit). The particular depletion threshold will depend on the particular application. As the depletion recovery circuit 222 reduces gain of the input audio signal to the audio power amplifier 220, the voltage on line 210 can recover. Upon recovering, the gain of the input signal can then be increased. By reducing the gain of the input audio signal, instances of peak clipping in the audio power amplifier 220 may be avoided and the intelligibility of the audio signal can be maintained.

It will be appreciated by those skilled in the art that, in the power control architecture 200, the power input stage 206 operates independently of the power output stage 216. The power input stage 206 merely boosts, or attempts to boost, the battery voltage up to a nominal boost voltage level at its output on line 210 while observing the budgeted input current limit. If the input current is at the input current limit, and the voltage on line 210 is below the nominal boost voltage level due to loading by the power output stage 216, then the power input stage will simply not be able to output sufficient current to raise the output voltage on line 210 due to the input current limit. Likewise, the power output stage 216 operates independent of the operation of the power input stage 206, and is only responsive to depletion conditions as indicted by the state of charge indication parameter, which can be, for example, the voltage of the boost capacitor 214 (i.e. on line 210).

Figure 3:
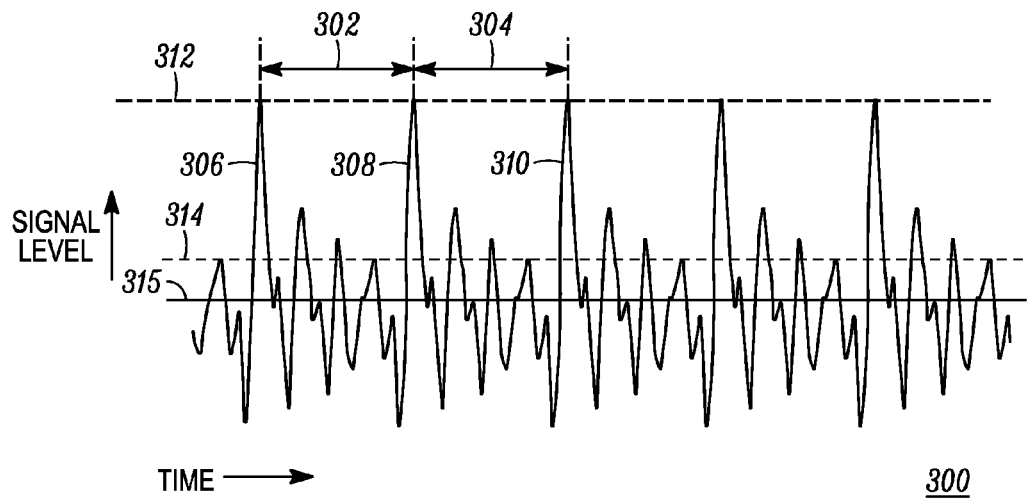
FIG. 3 is a signal diagram of an example of vowelic speech that can be amplified, including peak amplification power that is higher than an input power limit due to the input current limit, in accordance with some embodiments.

FIG. 3 is a signal diagram of an example of vowelic speech signal 300 that can be amplified including peak amplification power that is higher than an input power limit due to an input current limit in accordance with some embodiments. Generally, speech contains sequences of fricative consonants, unvoiced sounds, explosive consonants, and voiced sounds (vowels). The majority of power in speech signals is in the vowel portions of speech, which are periodic.

The human speech organ produces voiced sounds by excitation of the vocal tract and nasal cavity by Dirac-pulse like pitch pulses generated by the vocal cords; air forced from the lungs builds up a pressure sufficient to force the vocal cords apart causing an air flow through the opening, yet, when the velocity of the air increases, the pressure drops and causes the vocal cords to block the air flow. This cycle is repeated producing a periodic signal of pitch pulses with average periods of $\frac{1}{125}$ Hz for adult males and $\frac{1}{210}$ Hz for adult females.

The vocal tract forms a series of resonators that may be modeled by four second order low pass filters in cascade, each with time variant Q and resonance frequency representing a formant. The excitation of this $8^{th}$ order filter by a train of pitch pulses causes the output of the vocal tract to be a periodic signal consisting of a transient followed by a dampened oscillation, as shown in vowel speech signal 300. Two pitch periods 302 and 304 are defined by three peaks 306, 308, 310. The peaks are at a peak level 312, while the root mean square (RMS) magnitude 314 is much lower (relative to a zero level 315). The ratio of the peak magnitude to the long term RMS magnitude of the signal 300 in human speech, known as the crest factor, is in the range from 12 dB to 20 dB, and is typically about 16 dB. The instantaneous power of the speech signal 300 is greater than the long term average power in less than 15% of the time. For the most powerful part of the vowel the crest factor is about 10 dB and the instantaneous power is greater than the short term average power in less than about 25% of the duration of the pitch period. Thus the audio power amplification circuit (e.g. 121 of FIG. 1) will have about 75% of the pitch period for recovery upon the initial transient currents drawn by the audio power amplifier.

The average pitch frequency of a male voice is 125 Hz, however, due to the intonation the pitch frequency varies from 80 Hz to 200 Hz. The pitch frequency varies from 136 Hz to 340 Hz for females (a scaling factor of 1.7 is applied, as the male larynx in average is 1.7 times larger than the female equivalent and the pitch frequency thus is 1.7 times lower). Assuming that the duty cycle of peak power in the pitch period is independent of pitch period, the most difficult signal to work with is that with maximum pitch period (i.e. a deep male voice). This is because peak power then occurs for longer durations, maximizing the energy per peak. Peaks, of course, occur less often, so that the average signal power is maintained. Thus, the intermediate energy storage circuit (e.g. 124 of FIG. 1) provides an energy reservoir to support peak power during the relatively short peak of each pitch period, which is then replenished during the relatively low power portion of the rest of the pitch period. The power of these peaks, at the output of the audio power amplifier, can significantly exceed the input power limit defined by the input current budget limit and the battery voltage. For a signal such as vowel signal 300, the pre-amplifier gain will not be adjusted since the energy reservoir of the intermediate energy storage circuit will not become depleted, despite the high power of the peaks in the amplified output signal. However, when an input signal does not have characteristics like vowel speech, and lasts long enough to cause depletion of the intermediate energy storage circuit, the gain of the input signal to the audio power amplifier is reduced to prevent distortion and preserve intelligibility.

Figure 4:
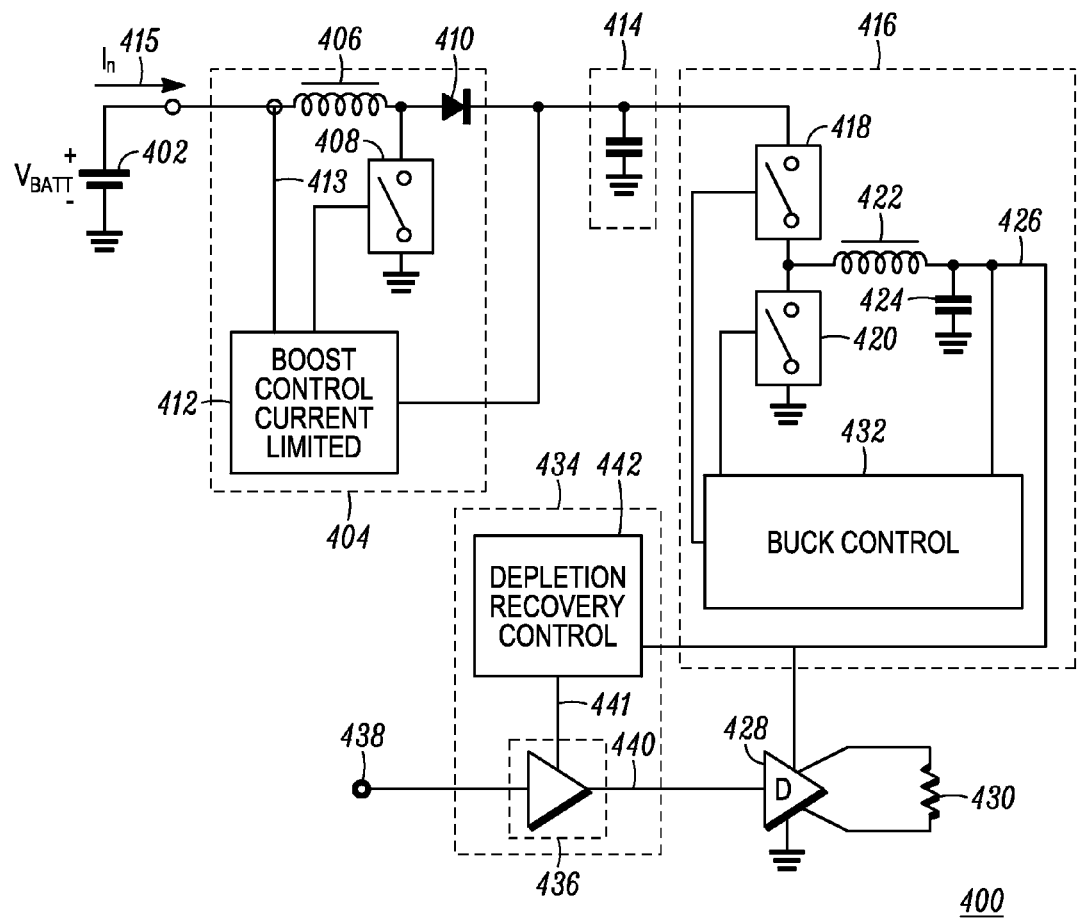
FIG. 4 is a block diagram of power control circuitry for audio power amplification, in accordance with some embodiments.

FIG. 4 is a block diagram of power control circuitry 400 for audio power amplification in accordance with some embodiments. The power control circuitry 400 receives power from a battery 402 that provides a battery voltage and a battery current 415. The power control circuitry 400 is only allowed to draw a preselected input current limit from the battery 402, which limits the amount of power that the battery can provide to the power control circuitry 400, including peak power since the input current limit must be observed at all times. The power control circuitry 400 includes several stages that make up an intermediate energy storage circuit, including a boost stage 404, a boost capacitor 414, a buck stage 416, and a depletion recovery circuit 434. The boost stage includes a boost inductor 406 through which current 415 flows. Current is drawn through the boost inductor 406 by a switch 408 that, when switched on, connects the boost inductor 406 to ground.

The switching of the switch 408 is controlled by a boost controller 412. The boost controller 412 also senses the current 415 to receive a current sense signal 413, which is used, in part, to control switching of the switch 408 to prevent the battery current 415 from exceeding the input current limit. When the switch 408 is opened (after being closed), current continues flowing through the boost inductor 406 due to energy stored in the magnetic field of the boost inductor 406, which then flows through boost diode 410 into boost capacitor 414, resulting in a boost voltage across the boost capacitor 414. The boost controller 412 senses the boost voltage to further control switching of switch 408 so that the boost voltage is at a pre-selected nominal boost voltage level under conditions of the booster sourcing enough power to cover both average and peak power demands. The nominal boost voltage level is substantially higher than the battery voltage and substantially higher than the supply voltage for audio power amplifier 428 required for it to output the preselected maximum peak output power into the load 430.

The boost voltage across the boost capacitor 414 is provided to the buck stage 416 which regulates the boost voltage down. An exemplary buck controller 432 controls and alternately switches a pair of switches including an upper switch 418 and a lower switch 420. When upper switch 418 is on, and lower switch 420 is off, current flows from the boost capacitor through a buck inductance 422. When the upper switch 418 is off, and lower switch 420 is on current continues flowing through the buck inductance 422, and from the ground through lower switch 420 to the buck inductance 422. The buck output voltage 426 is filtered by a buck capacitor 424. In embodiments using a buck stage, the buck output voltage 426 is the supply voltage for the audio power amplifier 428, which can for example be a class D amplifier. The audio power amplifier 428 amplifies an input signal 440 by a gain factor, and provides a power amplified version of the input signal 440 to a load 430 (e.g. a speaker). Accordingly, the buck stage 416 provides power to the audio power amplifier 428 as needed, including for peak power periods where the peak power is greater than that which can be sourced by the battery due to the input current limit. The energy stored in the boost capacitor can facilitate those power peaks.

The supply voltage to the audio power amplifier 428, which in the present example is the buck voltage output 426, is monitored by a depletion recovery controller 442 of the depletion recover circuit 434 as the state of charge indication parameter, which is also the supply voltage provided to the audio power amplifier 428. As indicated previously, the state of charge indication parameter is dependent on the boost voltage, and here, the buck voltage output 426 is dependent on the boost voltage since the boost voltage must be above the buck nominal voltage output 426 level. While the supply voltage is at or above a depletion threshold the depletion recovery controller 442 outputs a gain signal 441 to control the pre-amplifier 436 of an input gain stage to a maximum gain. The pre-amplifier 436 amplifies an audio signal input at 438 to produce the input signal 440 that is provided to the audio power amplifier 428. When the supply voltage drops below the depletion threshold, the depletion recovery controller 442 adjusts the gain signal 441 to reduce the gain of the pre-amplifier 436, thereby reducing the gain of the input signal 440 provided to the audio power amplifier 428, which in turn reduces the output power demand by the audio power amplifier so as to substantially avoid peak clipping in the audio power amplifier 428. The gain signal can be adjusted in any of several ways, including, for example, reducing the gain as a rate of decibels over time. When the supply voltage rises back above a depletion threshold, it may be the same as that for onset of depletion condition or different to provide hysteresis, the gain signal 441 is adjusted to increase the gain of the pre-amplifier 436 back to the maximum gain setting, assuming the supply voltage remains above the depletion threshold. When sensing of the supply voltage is applied, as in 400, the buck output voltage 426 and the depletion threshold may be chosen such that a voltage margin ensures sustained audio power amplifier performance during depletion recovery.

Figure 5:
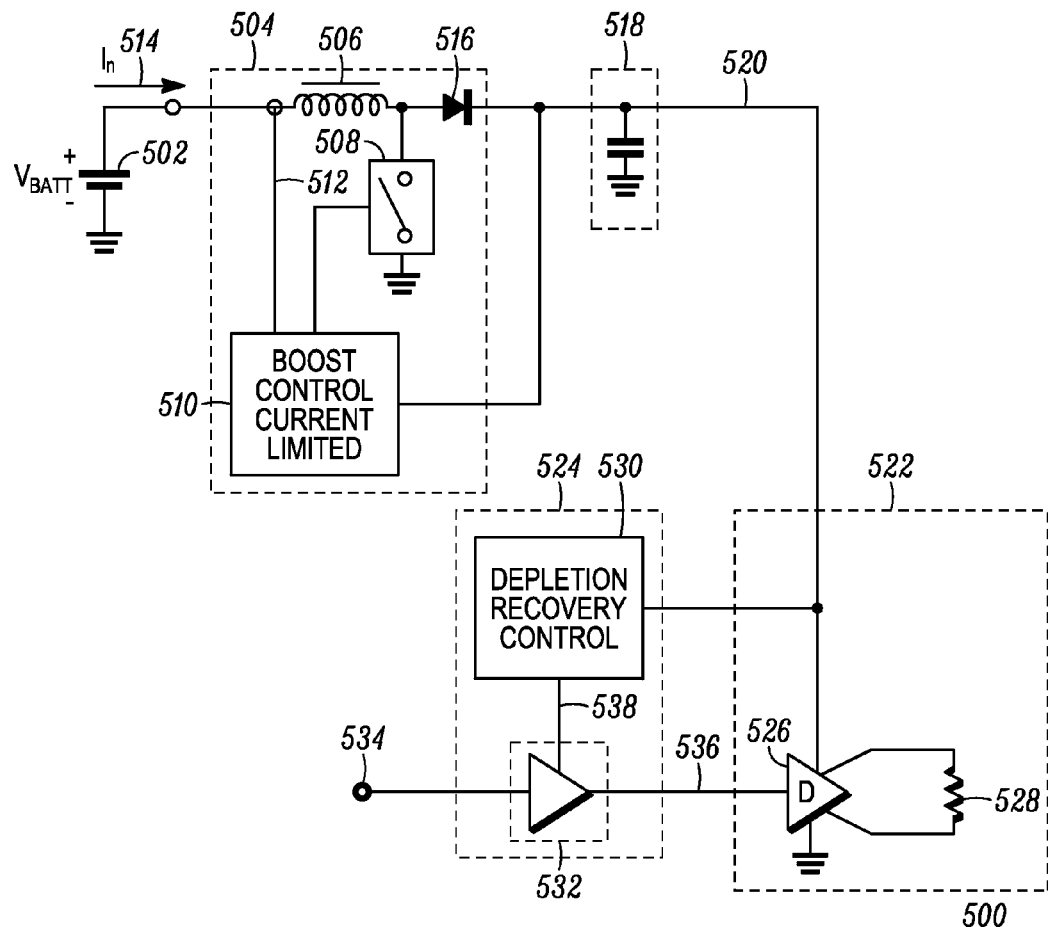
FIG. 5 is a block diagram of power control circuitry for audio power amplification, in accordance with some embodiments.

FIG. 5 is a block diagram of power control circuitry 500 for audio power amplification in accordance with some embodiments. The power control circuitry 500 is similar to that of FIG. 4, except that the buck stage, or an equivalent function, is essentially incorporated into the audio power amplifier 526, as for example the inherent buck converter function of a class-D amplifier. Accordingly, a battery 502 provides a battery voltage $V_{batt}$ and a battery current 514. A boost stage 504 includes a series boost inductor 506 through which current 514 flows. Current is drawn through the boost inductor 506 by a switch 508 that, when switched on, connects the boost inductor 506 to ground. The switching of the switch 508 is controlled by a boost controller 510. The boost controller 510 also senses the current 514 to receive a current sense signal 512, which is used, in part, to control switching of the switch 508 to prevent the battery current 514 from exceeding the budgeted current limit. When the switch 508 is opened (after being closed), current continues flowing through the boost inductor 506 due to energy stored in the magnetic field of the boost inductor 506, which then flows through boost diode 516 into boost capacitor 518, resulting in a boost voltage across the boost capacitor 518. The boost controller 510 senses the boost voltage to control switching of switch 508 so that the boost voltage is at a pre-selected nominal level, under conditions of the booster sourcing enough power to cover both average and peak power demands, and which is substantially higher than the battery voltage and substantially higher than the supply voltage for audio power amplifier 526 required for it to output the pre-selected maximum peak output power into the load 528.

In embodiments in accordance with the power control circuitry 500 a buck or step down of the boost voltage 520 can be incorporated into the audio power amplifier 526. Accordingly, the supply voltage for the audio power amplifier 526 is derived directly from the boost voltage 520 across the boost capacitor, rather than from a buck stage as in embodiments in accordance with FIG. 4. The supply voltage, therefore, is a voltage across a storage capacitor (e.g. the boost capacitor or buck capacitor) that is monitored by the depletion recovery controller 530 (or 442 of FIG. 4) as a state of charge indication parameter. When the voltage across one of these storage capacitors begins dropping it is because the power output of the audio power amplifier has drained energy from the energy storage of the power control circuitry 500 (or 400) and it is greater than power that can be sourced from the battery due to the input current budget limit. When a depletion condition is detected, such as when the boost voltage 520, used as the supply voltage here, falls below a depletion threshold, the depletion recovery circuit 524 adjusts the gain of the input signal 536 fed to the audio power amplifier 526 of the output stage 522, causing it to output less power to the speaker load 528. The depletion recovery controller 530 adjust a gain control signal 538 to adjust the gain of the pre-amplifier 532. The pre-amplifier 532 applies an adjustable gain factor to an audio signal 534 to produce the input signal 536 provided to the audio power amplifier 526. After the boost voltage 520 has dropped below the depletion threshold, and then recovers back to its nominal level, as controlled by the boost controller 510, the depletion recovery controller 530 can detect the boost voltage 520 being above a depletion threshold, it may be the same as that for onset of depletion condition or different to provide hysteresis, and adjust the gain control signal 538 to increase the gain of the pre-amplifier 532. Furthermore, it will be appreciated by those skilled in the art that the audio power amplifier 526 (and 428) can have its own gain setting that is adjusted, for example, by a user-controlled volume setting, such as a knob or other means. Accordingly, the depletion recovery action of adjusting the gain setting of the pre-amplifier occurs independently of the user-controlled volume setting that directly adjusts the audio power amplifier gain.

It will be appreciated by those skilled in the art that a hybrid of the topologies shown in FIGS. 4-5 can equivalently be employed, where a buck regulator is used to generate a supply voltage for the audio power amplifier, and the boost voltage is monitored by the depletion recovery circuit. Hence, as described herein, the depletion recovery circuit, regardless of the specific topology used, monitors a state of charge indication parameter that is dependent on the boost voltage. The state of charge indication parameter can be the boost voltage, a divided version of the boost voltage, the supply voltage provided to the audio power amplifier, or any other suitable voltage that is dependent on the boost voltage and that can indicate a depletion condition which necessitates recovery action such as adjusting the gain of the pre-amplifier.

Figure 6:
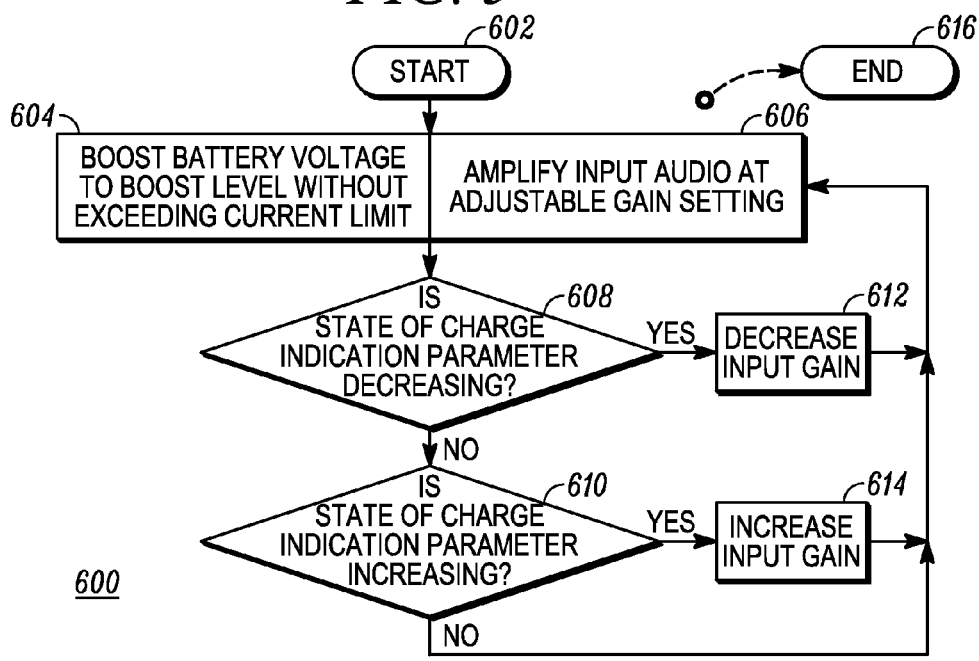
FIG. 6 is a flow chart diagram of a method of controlling audio power for audio power amplification, in accordance with some embodiments; and Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

FIG. 6 is a flow chart diagram of a method 600 of controlling power for audio power amplification in accordance with some embodiments. The method 600 can represent operation of embodiments of the power control circuitry such as, for example, that shown in FIGS. 4-5. At the start 602 the power control circuitry is assumed to be powered up and operating and an audio signal is being received that is being amplified to drive a speaker. Although shown as a flowchart, those skilled in the art will appreciate that the processes described in the various "steps" can occur contemporaneously and that there is no delay or buffering implied between the processes by use of flowchart elements. In step 604 the boost stage attempts to boost the input battery voltage up to a boost voltage across a boost capacitor, subject to an input current limit based on an input current budget limit for the power control circuitry. The received audio signal passes through a pre-amplifier gain stage to produce an input signal that is provided to the audio power amplifier. Thus, step 606 indicates that the audio power amplifier amplified the input signal at the adjusted gain setting. Under non-depletion conditions, the gain setting can be adjusted to a maximum gain. A depletion recovery circuit monitors a state of charge indication parameter that is dependent on the boost voltage to detect a depletion condition which is indicated when the state of charge indication parameter falls below a depletion threshold. The state of charge indication parameter can be the boost voltage, the output voltage of a buck stage after the boost stage, both, or an estimated boost capacitor voltage obtained by numerical computations in real time based on a mathematical model of the system and the applied audio signal.

In step 608 the depletion recovery circuit determines whether the monitored voltage is decreasing, or at least decreased below the depletion threshold. If not, then in step 610 the depletion recovery circuit determines whether the monitored voltage is increasing or increased above a depletion threshold, which may be the same as that for onset of the depletion condition or different, while the gain setting of the pre-amplifier is below its maximum setting. If not, then the no action is taken. If, in step 608, the supply voltage is decreasing or is otherwise below the depletion threshold, then in step 612 the gain setting of the pre-amplifier is decreased. It can be decreased by a step value or linearly at a rate such as by decibels over time. In step 614, if the supply voltage has increased subsequent to a depletion event where the gain of the pre-amplifier was lowered, and then is above a depletion threshold, then the gain can be increased accordingly up to the maximum gain setting. The method ends 616 when there is no audio signal being received and in some embodiments the power control circuitry can be turned off to conserve power.

The audio power control circuitry of the various embodiments provides the benefit of allowing amplification of received audio signals without significant distortion or exceeding an input current budget limit where the amplified signals have peaks that significantly exceed the available input power due to the input current limit by use of an intermediate energy storage circuit. In some conditions, due to the characteristics of speech, peaks in the received audio signal can be reproduced at the amplified level by drawing power from the intermediate energy storage. In cases where the audio signal being amplified begins to deplete the intermediate energy storage, fidelity of the amplified signal can be maintained by detecting the onset of the depletion condition and reducing the power applied to the signal being amplified by reducing the gain of a pre-amplifier stage. When the intermediate energy storage stage recovers, the gain of the pre-amplifier can be increased to restore operation at the desired amplification power. By adjusting the power applied to the signal being amplified the fidelity of the signal can be maintained.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

I claim:

1. A method for powering an audio power amplifier, comprising:
   boosting a voltage level of a battery to a boost voltage level across a boost capacitor at an output of a boost stage without exceeding a preselected input current limit, the boost voltage level being higher than the voltage level of the battery and higher than a supply voltage required for the audio power amplifier to output a predefined maximum peak power into a load;
   deriving the supply voltage from the boost voltage and providing the supply voltage to the audio power amplifier to power the audio power amplifier;
   the audio power amplifier amplifying an input signal to produce an amplified signal;
   comparing a state of charge indication parameter to a depletion threshold, wherein the state of charge indication parameter is dependent on the boost voltage; and
   when the state of charge indication parameter is below the depletion threshold, adjusting a gain of a pre-amplifier that provides the input signal to the audio power amplifier.

2. The method of claim 1, wherein adjusting the gain comprises reducing the gain of the pre-amplifier.

3. The method of claim 2, wherein reducing the gain of the pre-amplifier is performed by reducing the gain at a preselected rate of decibels over time.

4. The method of claim 1, further comprising when the gain of the pre-amplifier is below a maximum gain and the state of charge indication parameter is at or above a depletion threshold, increasing the gain of the pre-amplifier.

5. The method of claim 4, wherein increasing the gain of the pre-amplifier is performed by increasing the gain at a preselected rate of decibels over time.

6. The method of claim 1, wherein deriving the supply voltage comprises stepping the boost voltage down in a buck stage between the boost stage and the audio power amplifier, an output of the buck stage providing the supply voltage.

7. The method of claim 6, wherein the state of charge indication parameter is the supply voltage provided to the audio power amplifier.

8. The method of claim 1, wherein the supply voltage is the output of the boost stage to the audio power amplifier.

9. The method of claim 1, wherein the current limit is based on an input current budget limit for a power amplifier circuit that performs the method.

10. The audio power amplifier circuit of claim 9, wherein the supply voltage is produced by a buck stage that steps the boost voltage down to the supply voltage.

11. The audio power amplifier circuit of claim 10, wherein the state of charge indication parameter is the supply voltage.

12. The audio power amplifier circuit of claim 9, wherein the supply voltage is the boost voltage level, and wherein the audio power amplifier steps the boost voltage level down to form an amplified audio signal.

13. The audio power amplifier circuit of claim 9, wherein the input gain stage decreases the input gain when the state of charge indication parameter falls below the depletion threshold.

14. The audio power amplifier circuit of claim 13, wherein the input gain stage decreases the input gain at a preselected rate of decibels over time while the state of charge indication parameter is below the depletion threshold.

15. The audio power amplifier circuit of claim 9, wherein the input gain stage increases the input gain when the input gain is below a maximum gain value and the state of charge indication parameter is at or above a depletion threshold.

16. The audio power amplifier circuit of claim 15, wherein the input gain stage increases the input gain at a preselected rate of decibels over time while the state of charge indication parameter is at or above a depletion threshold and the input gain is below the maximum gain value.

17. An audio power amplifier circuit, comprising:
   a boost stage that produces a boost voltage level from a battery voltage without exceeding a preselected current limit for a current budget of the audio power amplifier, wherein the boost voltage level is provided across a boost storage capacitor;

an audio power amplifier that is supplied at a supply voltage level derived from the boost stage and amplifies an input signal; and an input gain stage that provides the input signal and which adjusts an input gain of the input signal based on a level of a state of charge indication parameter relative to a depletion threshold, where the state of charge indication parameter is dependent on the boost voltage.

18. A portable two-way radio device, comprising:

a transceiver that receives an audio signal in a radio frequency (RF) signal and extracts the audio signal from the RF signal;

an audio power amplifier circuit that includes a boost stage that produces a boost voltage level from a battery voltage without exceeding a preselected input current budget limit of the audio power amplifier circuit, wherein the boost voltage level is provided across a boost storage capacitor;

the audio power amplifier circuit further including an audio power amplifier that amplifies an input signal and is supplied at a supply voltage level derived from the boost stage;

the audio power amplifier circuit further including a pre-amplifier that amplifies the audio signal at an adjustable gain setting to provide the input signal to the audio power amplifier; and the audio power amplifier circuit further including a depletion recovery control circuit that adjusts the adjustable gain setting of the pre-amplifier based on a level of state of charge indication parameter level relative to a depletion threshold where the state of charge indication parameter is dependent on the boost voltage.

19. The portable two-way radio device of claim 18, wherein the supply voltage is produced by a buck stage that steps the boost voltage down to the supply voltage level.

20. The portable two-way radio device of claim 19, wherein the state of charge indication parameter is the supply voltage level.

21. The portable two-way radio device of claim 18, wherein the supply voltage is the boost voltage level, and wherein the audio power amplifier steps the boost voltage level down to form an amplified audio signal.

22. The portable two-way radio device of claim 18, wherein, in response to the state of charge indication parameter falling below the depletion threshold, the depletion recovery control circuit decreases the adjustable gain of the pre-amplifier at a preselected rate of decibels over time.

23. The portable two-way radio device of claim 18, wherein, in response to the state of charge indication parameter rising above a depletion threshold while the adjustable gain of the pre-amplifier is below a maximum gain setting, the depletion recovery control circuit increases the adjustable gain of the pre-amplifier at a preselected rate of decibels over time.

* * * * *